(12) United States Patent
Kim et al.

(10) Patent No.: US 11,885,851 B2
(45) Date of Patent: Jan. 30, 2024

(54) JIG FOR BATTERY CHARGING AND DISCHARGING TEST

(71) Applicant: WONIK PNE CO., LTD., Suwon-si (KR)

(72) Inventors: Sockjun Kim, Suwon-si (KR); Yonghwan Choi, Suwon-si (KR)

(73) Assignee: WONIK PNE CO., LTD., Suwon-si (KR)

( * ) Notice: Subject to any disclaimer, the term of this patent is extended or adjusted under 35 U.S.C. 154(b) by 54 days.

(21) Appl. No.: 17/516,429

(22) Filed: Nov. 1, 2021

(65) Prior Publication Data
US 2023/0093445 A1   Mar. 23, 2023

(30) Foreign Application Priority Data

Sep. 17, 2021   (KR) .......................... 10-2021-0124435

(51) Int. Cl.
*G01R 31/36* (2020.01)
*H01M 50/202* (2021.01)
(Continued)

(52) U.S. Cl.
CPC .... *G01R 31/3644* (2013.01); *H01M 10/4285* (2013.01); *H01M 10/44* (2013.01); *H01M 50/202* (2021.01); *H01M 50/244* (2021.01)

(58) Field of Classification Search
None
See application file for complete search history.

(56) References Cited

U.S. PATENT DOCUMENTS 7,586,288 B2 *  9/2009  Onishi .................. H01M 10/46
                                              361/535
2014/0210413 A1   7/2014  Yoon et al.
(Continued)

FOREIGN PATENT DOCUMENTS

EP            2398089 A    12/2011
KR    20-2000-0017753 U    10/2000
(Continued)

OTHER PUBLICATIONS

Heungin Hall; Battery Pack KR 20170047539 A; Date Published May 8, 2017; H 01 M 2/1016 (Year: 2017).*
(Continued)

*Primary Examiner* — Nasima Monsur
(74) *Attorney, Agent, or Firm* — Maschoff Brennan

(57) ABSTRACT

A jig for a battery charging and discharging test includes a first frame and a second frame which are disposed in parallel to each other so as to be spaced apart from each other. Two mounting rails are installed to protrude forward to connect the first and second frames, and have slit grooves open in directions facing each other. Each have an open side, such that the battery pack is mounted on the mounting rails through a rail-type structure. An anode unit and a cathode unit are arranged on either side of the mounting rails, and brought into contact with a first terminal and a second terminal of the battery pack coupled to the mounting rails, respectively. The jig can fix a battery at various angles to flexibly cope with various test environments, in order to perform a battery charging and discharging test.

14 Claims, 12 Drawing Sheets

(51) Int. Cl.
*H01M 50/244* (2021.01)
*H01M 10/42* (2006.01)
*H01M 10/44* (2006.01)

(56) References Cited

U.S. PATENT DOCUMENTS

| | | | |
|---|---|---|---|
| 2015/0171389 A1* | 6/2015 | Ejima | H01M 50/249 |
| | | | 429/99 |
| 2016/0276716 A1* | 9/2016 | Lee | H01M 10/4285 |
| 2018/0074130 A1 | 3/2018 | Jeung et al. | |

FOREIGN PATENT DOCUMENTS

| | | |
|---|---|---|
| KR | 10-2016-0066725 A | 6/2016 |
| KR | 10-2021-0097302 A | 8/2021 |

OTHER PUBLICATIONS

Korean Office Action dated Jan. 18, 2022 as received in application No. 10-2021-0124435.
European Search Report dated Apr. 19, 2022 as received in application No. 21204950.6.

\* cited by examiner

[FIG. 1]
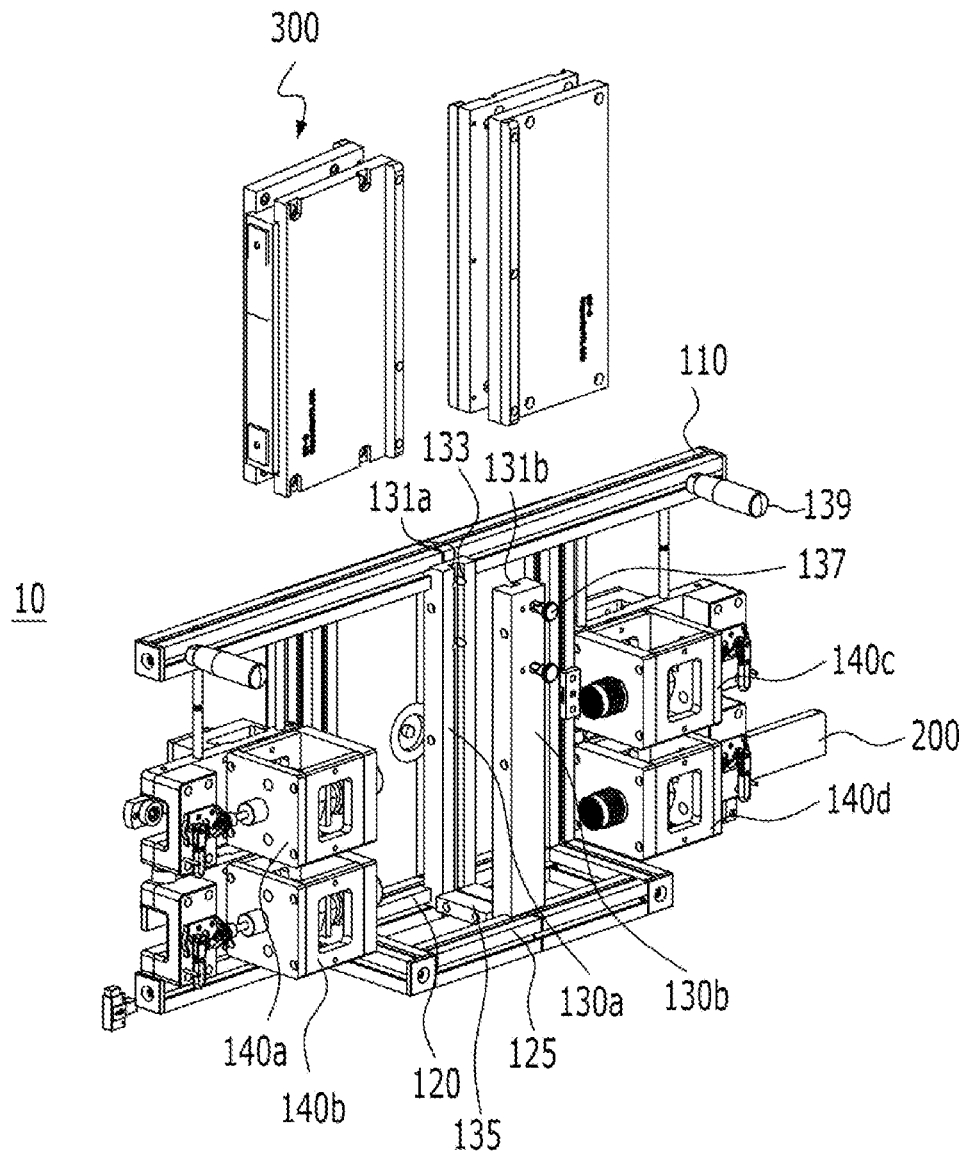

[FIG. 2]
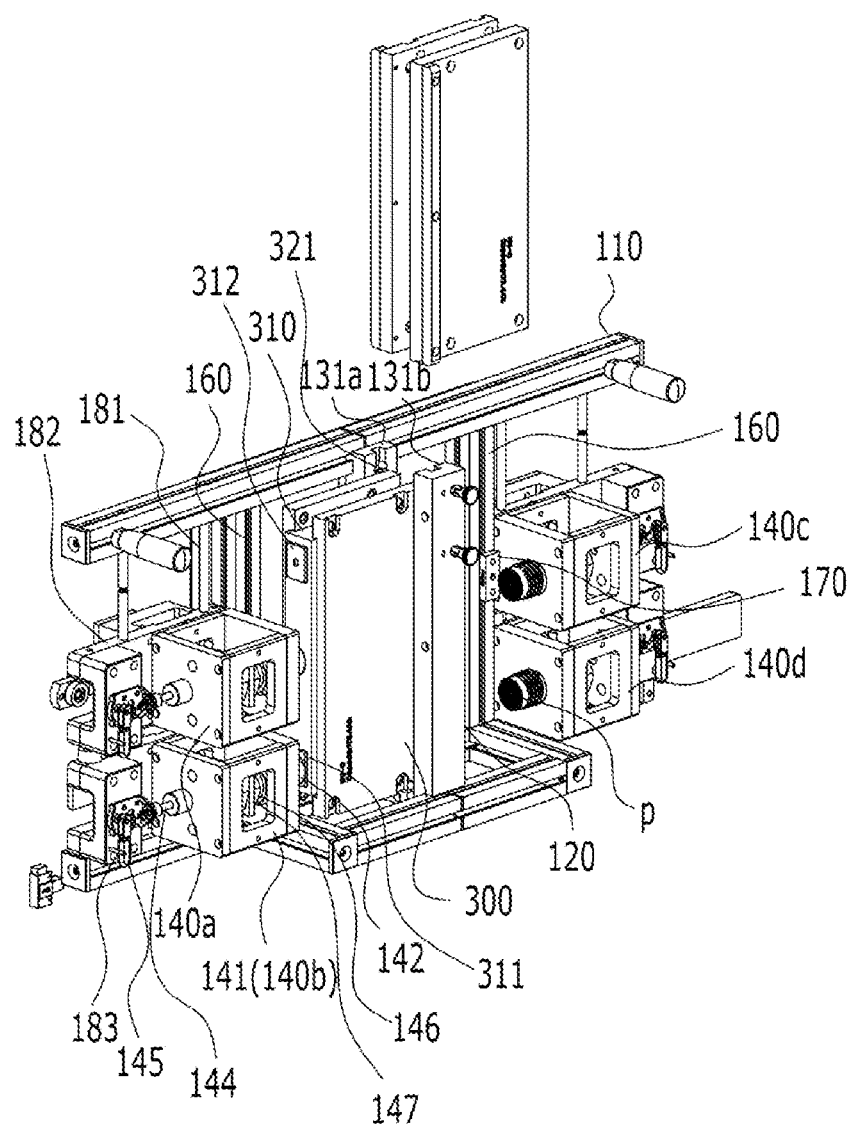

[FIG. 3]
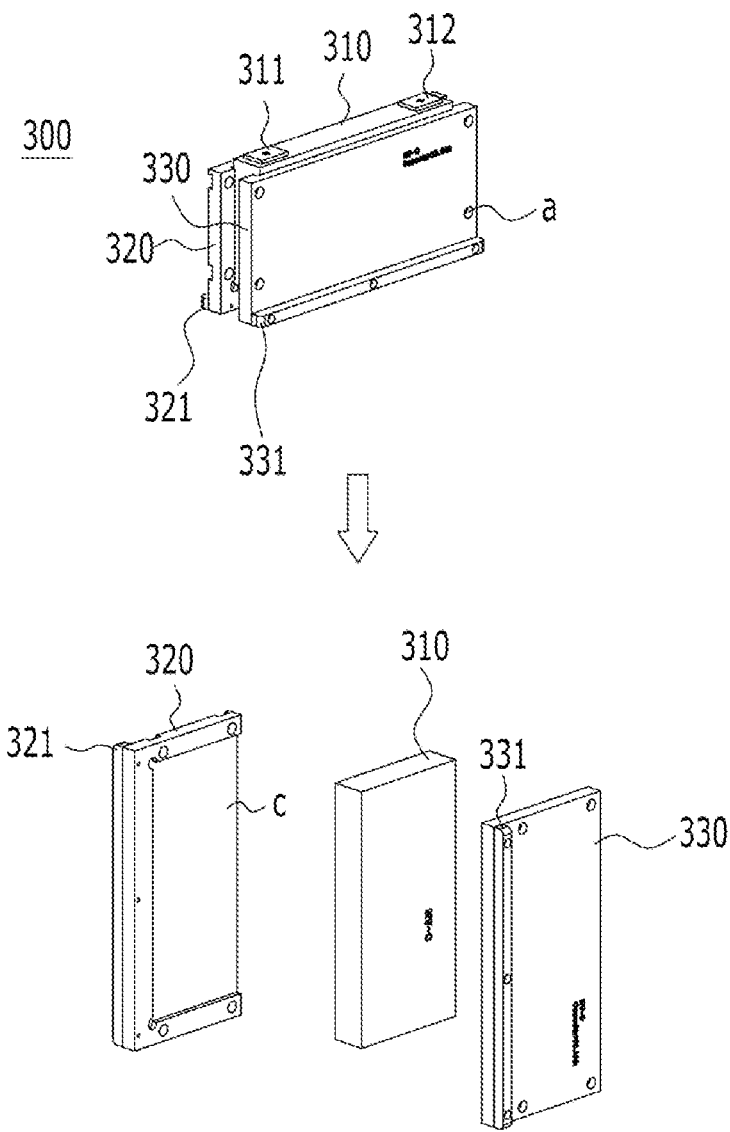

[FIG. 4]
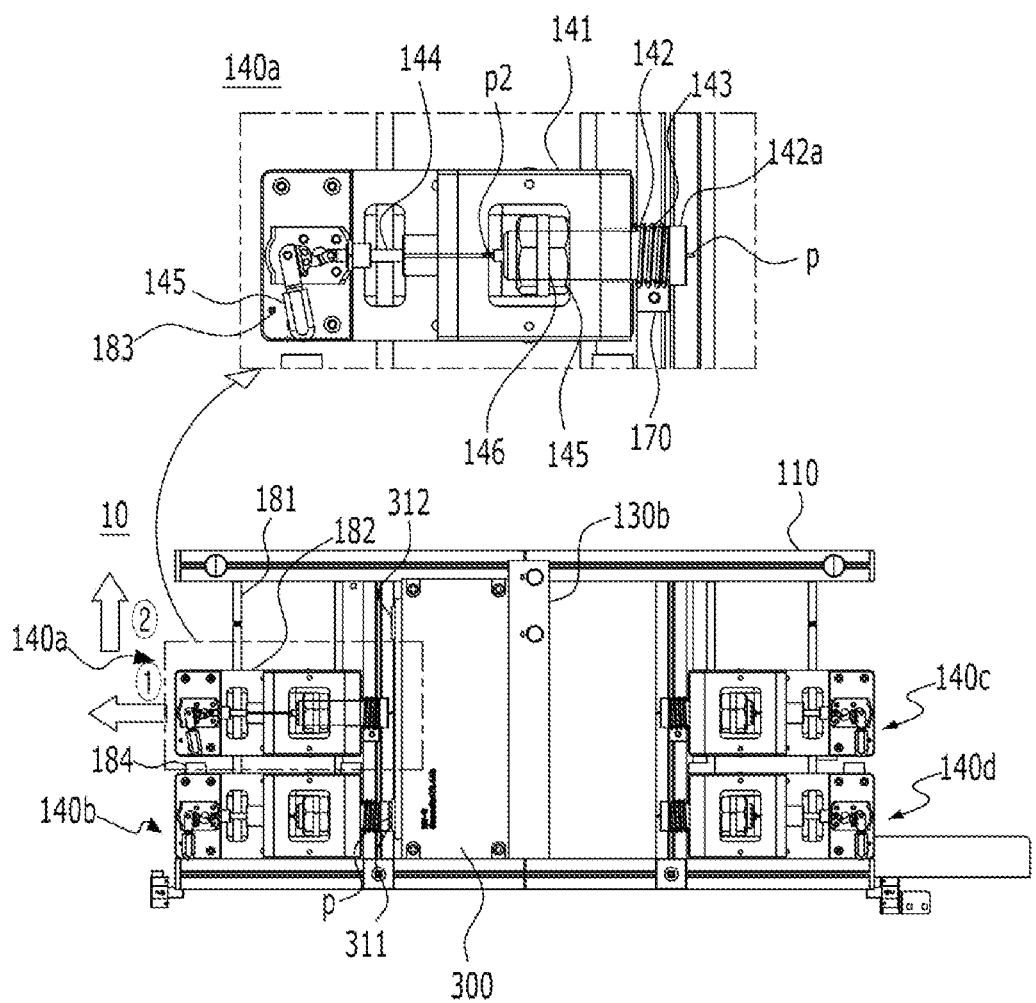

[FIG. 5]
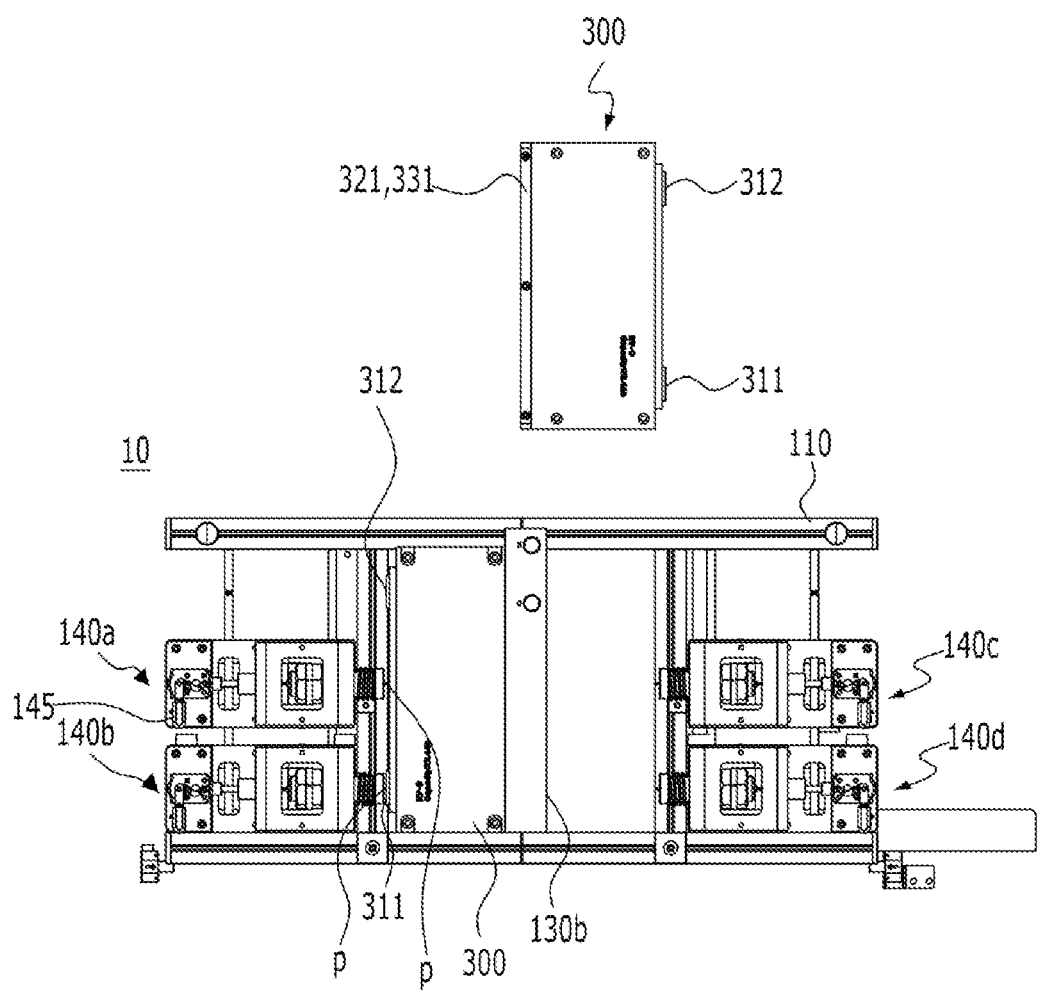

[FIG. 6]
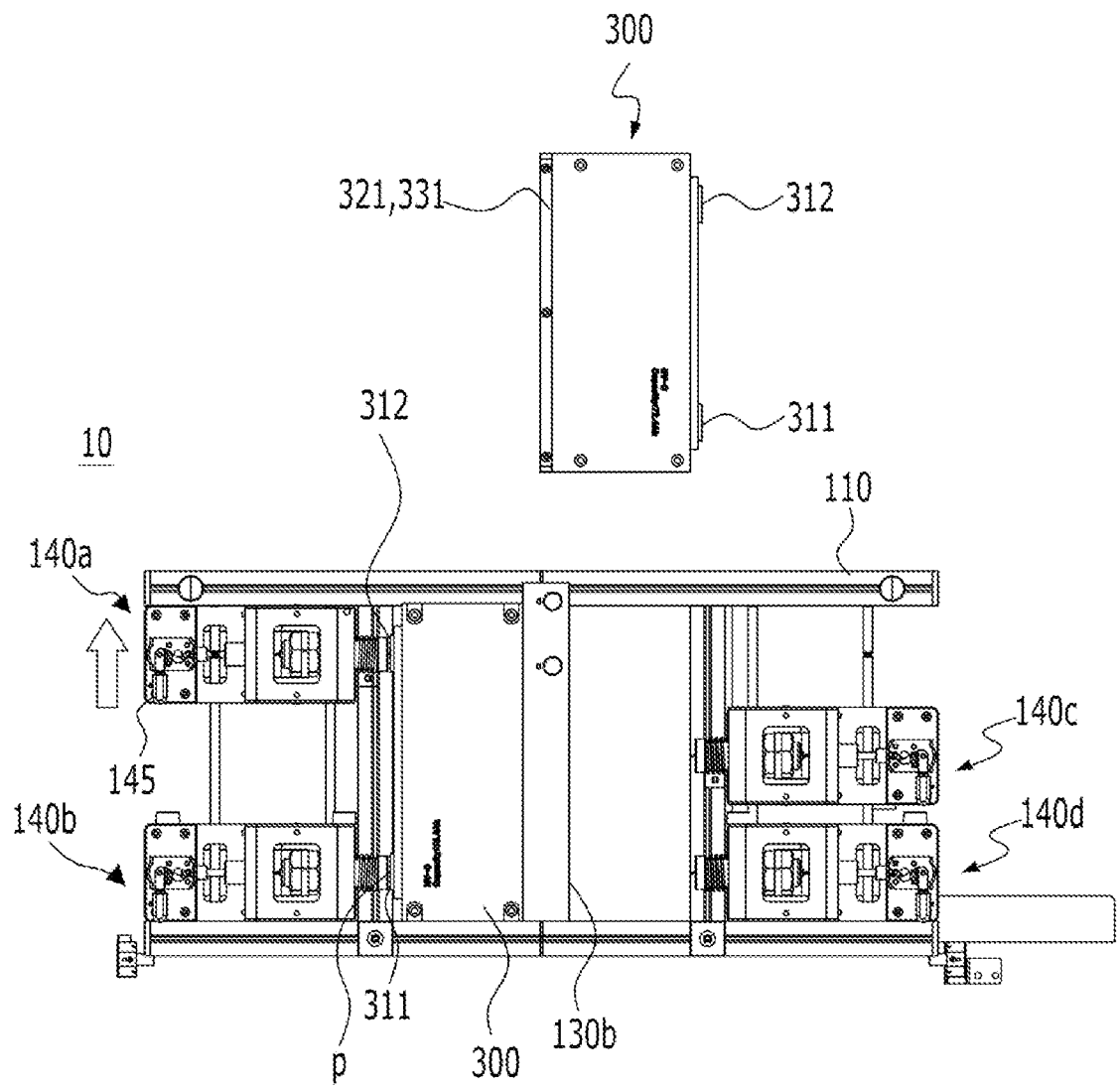

[FIG. 7]
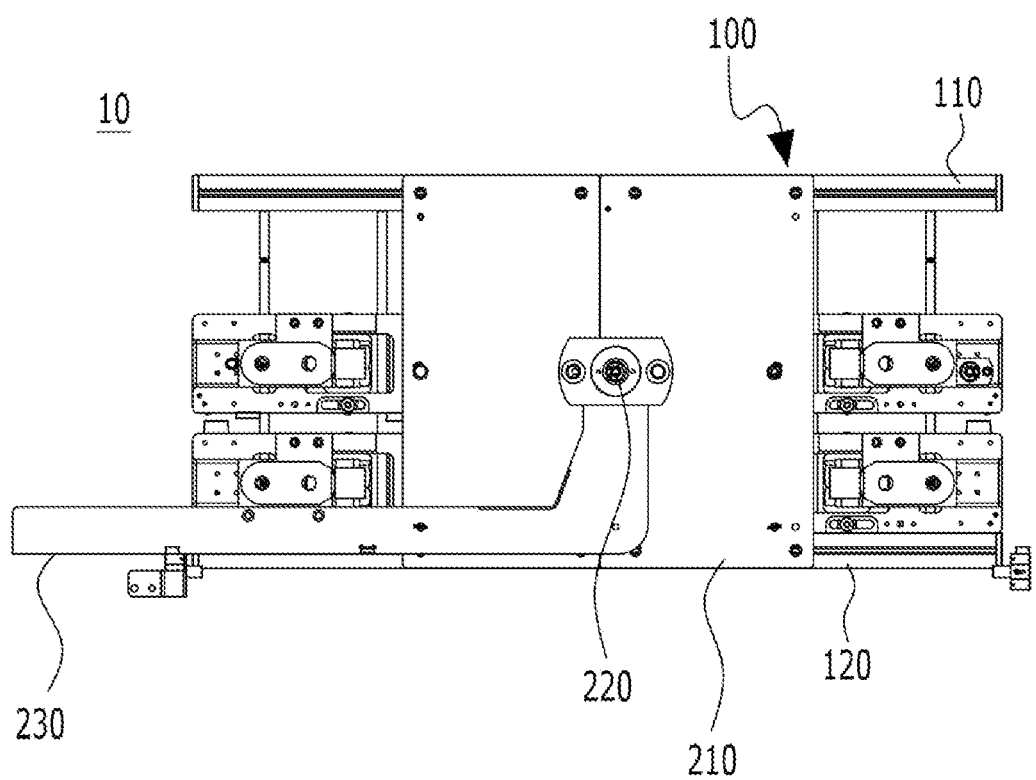

[FIG. 8]
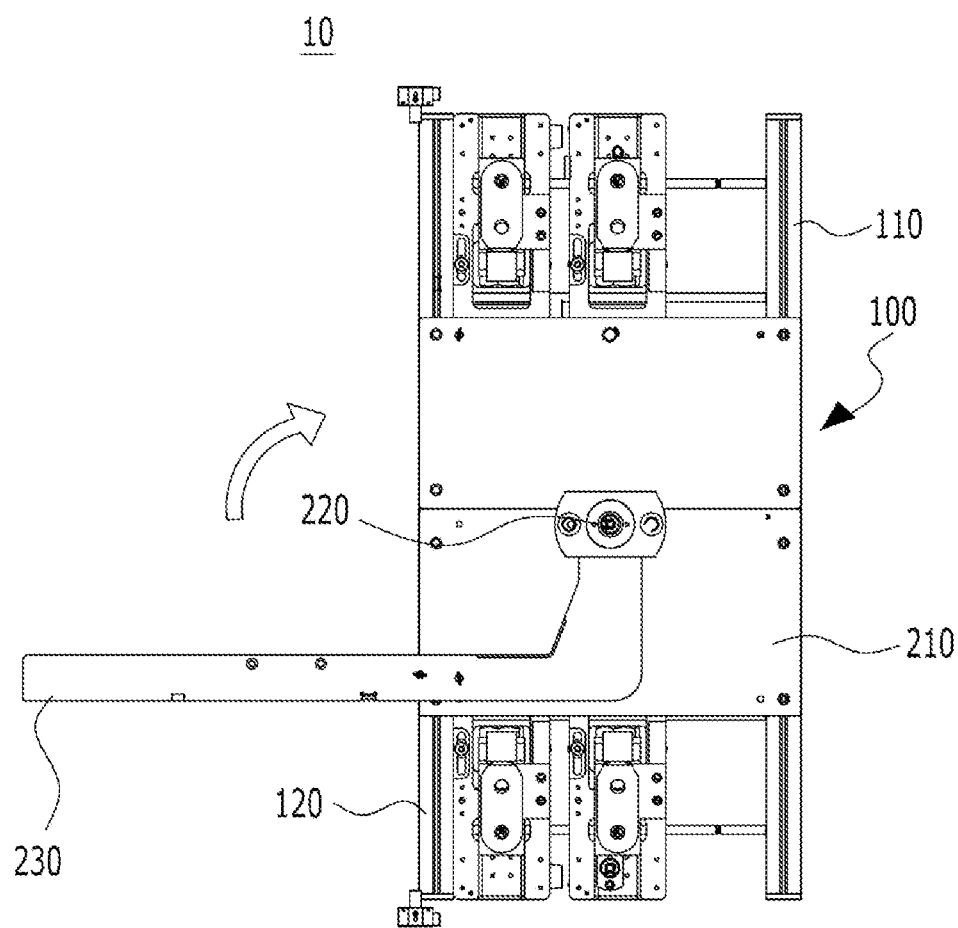

[FIG. 9]
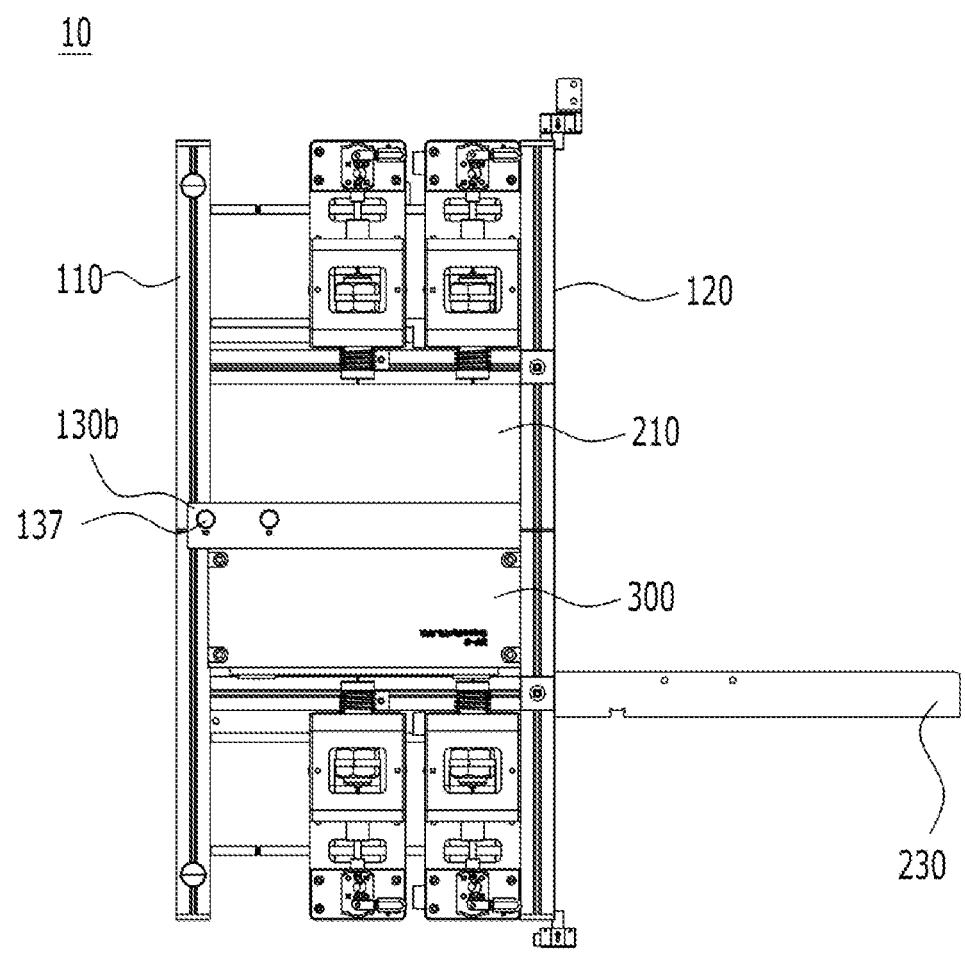

[FIG. 10]
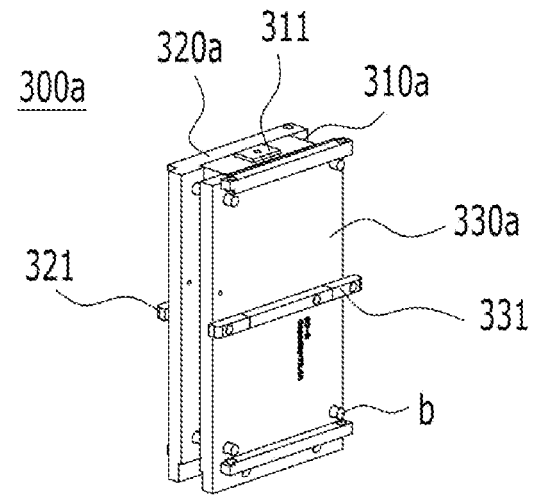
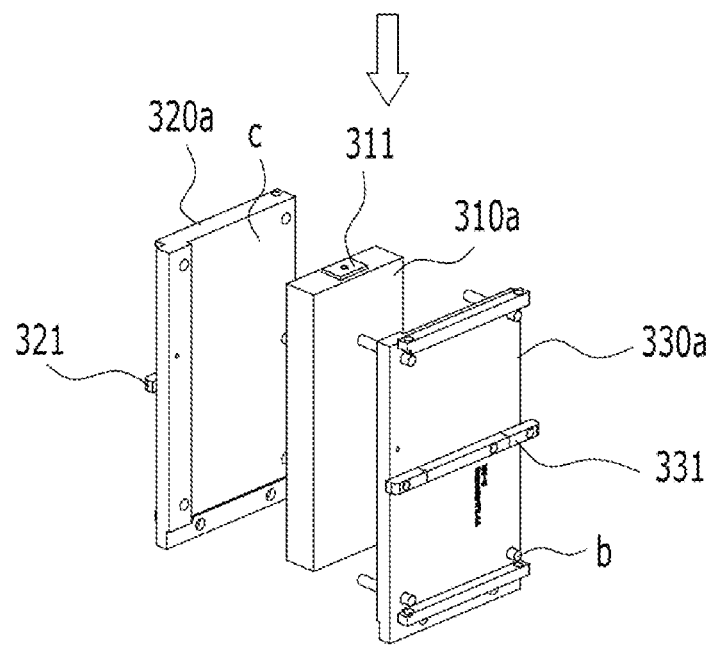

[FIG. 11]
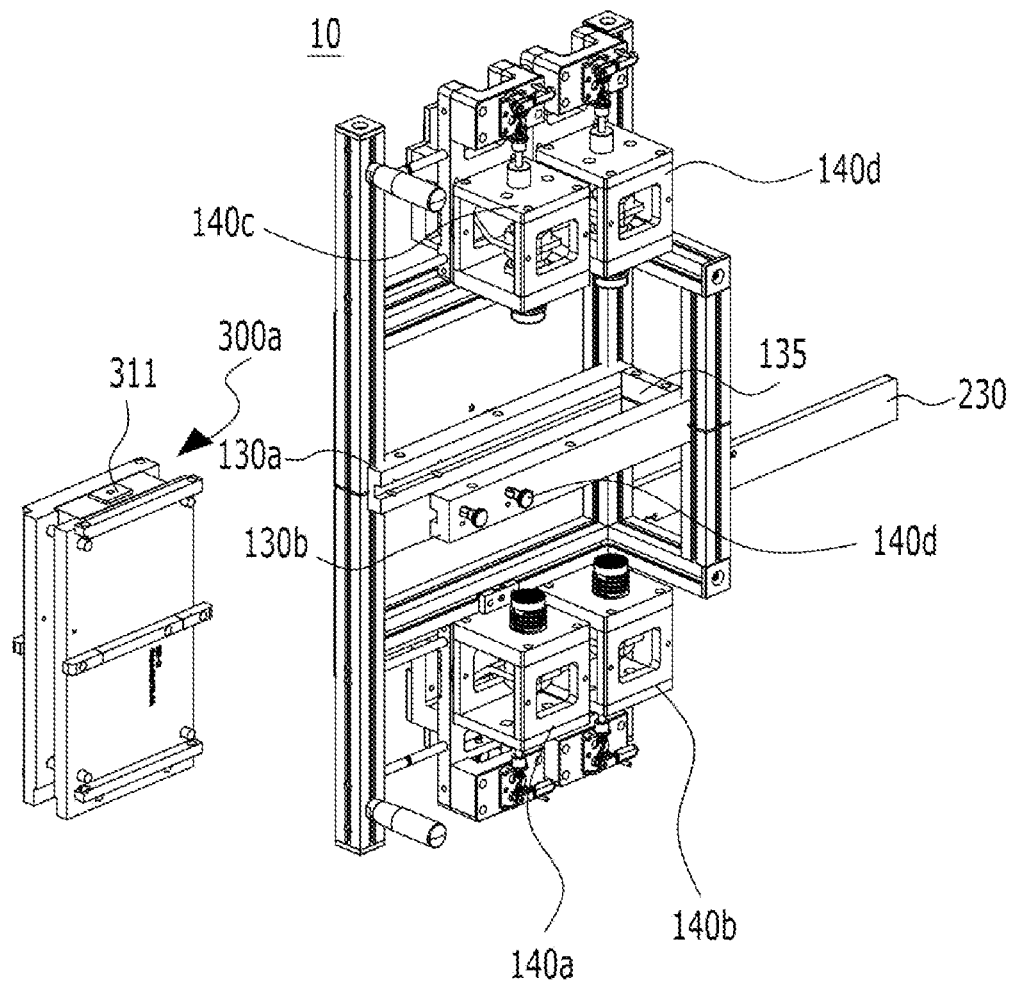

[FIG. 12]
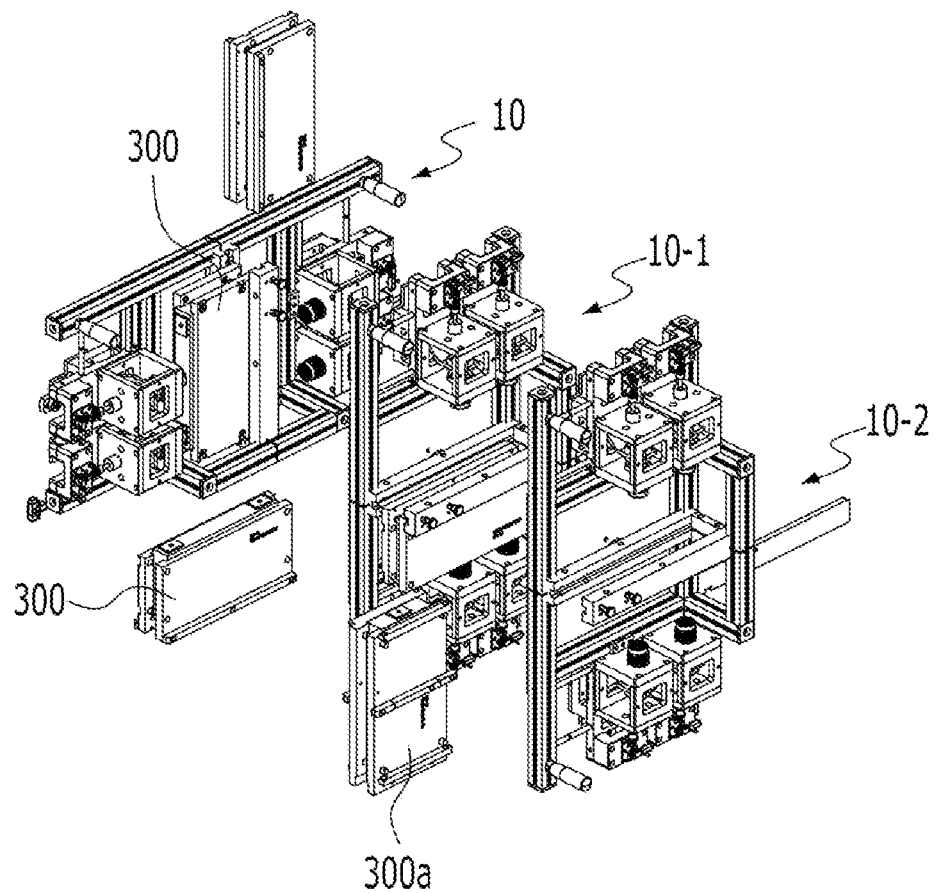

JIG FOR BATTERY CHARGING AND DISCHARGING TEST

TECHNICAL FIELD

The present disclosure relates to a jig for a battery charging and discharging test, and more particularly, to a jig for a battery charging and discharging test, which fixes a battery to cope with various battery test environments during a battery charging and discharging test.

BACKGROUND ART

Electric vehicle batteries may be divided into cylindrical, prismatic and pouch batteries depending on the shapes thereof. At the early stage, the cylindrical battery was the mainstream because Tesla has used the cylindrical battery. Recently, however, the use of the prismatic battery and the pouch battery has increased because the prismatic battery and the pouch battery are suitable for weight reduction, have high energy density and can be manufactured in various sizes. In particular, the prismatic battery has advantages in that it can increase the space efficiency and the degree of freedom in design.

As an electric vehicle battery, an LFP (lithium iron phosphate) battery is mainly used, which can be charged with electric energy and discharged. Such a battery is subjected to a charging and discharging characteristic test for testing the performance, lifetime and stability of the battery while repeatedly charging and discharging the battery, during a process of shipping the battery as a product.

The battery charging and discharging test is performed through a method of measuring the operation states of a plurality of batteries arranged in a chamber set in a specific environment, while charging and discharging the batteries in the corresponding environment. At this time, a jig is used to fix the plurality of batteries such that the anode and cathode of each of the batteries are vertically placed to face upward, and the plurality of batteries which are vertically placed on the jig are fed into the chamber together with the jig.

In the related art, since the batteries are vertically placed on the jig and fed into the chamber during the battery charging and discharging test, the charging and discharging test is performed with the batteries fixed only in the vertical direction, which makes it difficult to cope with various battery test environments.

DISCLOSURE

Technical Problem

The present disclosure is proposed to solve the above conventional problem, and an object of the present disclosure is to provide a jig for a battery charging and discharging test, which fixes a battery at various angles to cope with various battery test environments, such that a battery charging and discharging test can be performed.

Technical Solution

To achieve the object, a jig for a battery charging and discharging test according to an exemplary embodiment of the present disclosure includes a first frame and a second frame which are disposed in parallel to each other so as to be spaced apart from each other; two mounting rails installed to protrude forward, configured to connect the first and second frames, and having slit grooves which are open in directions facing each other and each have an open side, such that the battery pack is mounted on the mounting rails through a rail-type structure; and an anode unit and a cathode unit which are arranged on either side of the mounting rails, and brought into contact with a first terminal and a second terminal of the battery pack coupled to the mounting rails, respectively.

The anode units and the cathode units are symmetrically installed on both sides of the mounting rails, such that the pairs of anode and cathode units are placed in parallel to each other, and cross-arranged at positions facing each other, such that the anode units face each other and the cathode units face each other.

The jig further includes a connection rail installed on either side of the mounting rails and configured to connect the first and second frames. The connection rail has a moving member installed thereon, and the moving member is connected to at least one of the anode unit and the cathode unit so as to be movable along the connection rail.

Each of the anode unit and the cathode unit includes: a support block formed in a hollow hexahedral shape; a terminal body installed through the support block, and having a terminal pin protruding from a leading end thereof; and an elastic spring installed on the outer circumferential surface of the terminal body protruding to the outside of the support block, disposed between the support block and a protrusion at the leading end of the terminal body, and configured to provide an elastic force that causes the terminal pin to protrude from the support block.

Each of the anode unit and the cathode unit includes: a movable shaft disposed coaxially with the terminal body, connected to the terminal pin protruding from the rear end of the terminal body, and configured to supply power to the terminal pin; and a lever connected to the movable shaft, and configured to reciprocate the movable shaft by pushing or pulling the movable shaft.

The jig includes: a bearing bracket coupled to the outer circumference of the terminal body located in the support block, and configured to movably support the terminal body; and a bearing fixing bracket having one side disposed in the support block and coupled to the outer circumference of the bearing bracket and the other side disposed and fixed outside the support block.

The jig further includes: a rotating plate configured to connect the rear surfaces of the first and second frames; a rotating shaft provided in the center of the rotating plate, and serving as the center of rotation of the rotating plate; and a fixing support bar having one end fixed to the rotating shaft.

The fixing support bar is elongated to have an end that protrudes to the outside of the rotating plate.

The first frame has a jig rotation handle which is provided on either side of the front surface thereof and protrudes in a direction orthogonal to the first frame.

The mounting rail has a stopper with which one side of the battery pack is brought into contact and by which the movement of the battery pack is limited, when the battery pack is mounted through a rail-type structure.

The jig further includes a U-shaped reinforcement frame connected to the second frame and configured to support one end of the mounting rail.

The battery pack includes: a prismatic battery having the first and second terminals; and a first support cover and a second support cover which are brought into contact with one sidewall and the other sidewall of the battery, fixed to each other by a fixing unit, and each have an insertion rib formed on the outer surface thereof so as to be inserted into the slit groove of the corresponding mounting rail.

The first and second terminals are provided on both sides of the battery, and the insertion ribs are formed on the middles of the outer surfaces of the first and second support covers, respectively, and elongated in a widthwise direction thereof.

The first and second terminals are provided on one side of the battery so as to be spaced apart from each other, and the insertion ribs are formed on one sides of the outer surfaces of the first and second support covers, respectively, and elongated in a longitudinal direction thereof.

The first and second support covers have seating surfaces facing each other, such that the battery is seated on the seating surfaces.

Advantageous Effects

According to the present disclosure, the jig for a battery charging and discharging test includes the jig body to which the battery is fixed around the rotating shaft, and the jig body can be rotated by 0, 90, 180 or 270 degrees. Thus, as the battery is disposed at 0, 90, 180 or 270 degrees, the battery charging and discharging test can be performed in various test environments.

Furthermore, since the jig body is easily rotated by the jig rotation handle provided on the jig body, it is possible to improve an operator's convenience during the battery charging and discharging test.

Moreover, the anode units and the cathode units are symmetrically installed on both sides of the mounting rails for fixing the battery, such that the pairs of anode and cathode units are placed in parallel to each other, and cross-arranged at positions facing each other, such that the anode units face each other and the cathode units face each other. Therefore, since the jig can be applied to a prismatic battery having terminals on both sides thereof or a prismatic battery having terminals only on one side thereof, various types of battery charging and discharging tests depending on various environments can be performed through one jig.

Furthermore, since the battery pack having the support covers coupled to both sidewalls of the battery is mounted on the jig for a battery charging and discharging test, the battery can be easily fixed to the jig, and the battery charging and discharging test can be reliably performed.

DESCRIPTION OF DRAWINGS

FIG. 1 is a perspective view illustrating a jig for a battery charging and discharging test in accordance with an embodiment of the present disclosure.

FIG. 2 is a perspective view illustrating that a battery pack is mounted on the jig for a battery charging and discharging test in accordance with the embodiment of the present disclosure.

FIG. 3 is a perspective view illustrating the battery pack in accordance with the embodiment of the present disclosure, showing that the battery pack is separated into a battery and support covers.

FIG. 4 is a front view illustrating the jig for a battery charging and discharging test in accordance with the embodiment of the present disclosure.

FIGS. 5 and 6 are diagrams illustrating a method of mounting the battery pack on the jig for a battery charging and discharging test in accordance with the embodiment of the present disclosure.

FIG. 7 is a rear view illustrating the jig for a battery charging and discharging test in accordance with the embodiment of the present disclosure.

FIG. 8 is a rear view illustrating that the jig for a battery charging and discharging test in accordance with the embodiment of the present disclosure is rotated.

FIG. 9 is a front view illustrating that the jig for a battery charging and discharging test in accordance with the embodiment of the present disclosure is rotated.

FIG. 10 is a perspective view illustrating a battery pack in accordance with another embodiment of the present disclosure, showing that the battery pack is separated into a battery and support covers.

FIG. 11 is a perspective view illustrating that the battery pack in accordance with the another embodiment of the present disclosure is mounted on a jig for a battery charging and discharging test.

FIG. 12 is a perspective view illustrating that the jig for a battery charging and discharging test in accordance with the embodiment of the present disclosure is rotated at various angles.

DESCRIPTION OF EMBODIMENTS

Hereafter, embodiments of the present disclosure will be described in detail with reference to the accompanying drawings.

FIG. 1 is a perspective view illustrating a jig for a battery charging and discharging test in accordance with an embodiment of the present disclosure.

As illustrated in FIG. 1, a jig 10 for a battery charging and discharging test in accordance with an embodiment of the present disclosure includes a jig body 100 and a rotating unit 200. The jig body 100 has a battery mounted thereon and is subjected to a charging and discharging test. The rotating unit 200 rotates the jig body 100 such that the battery can be placed at various angles during the charging and discharging test. The battery is configured in the form of a battery pack 300 having support covers coupled to both sides thereof, and mounted on the jig body 100. The support cover will be described below in detail with reference to FIG. 3.

The jig body 100 includes a first frame 110, a second frame 120, mounting rails 130*a* and 130*b*, anode units 140*a* and 140*d* and cathode units 140*b* and 140*c*.

The first and second frames 110 and 120 are basic frames constituting the frame of the jig body 100. The first and second frames 110 and 120 are formed in a rectangular pipe shape, and placed in parallel to each other while spaced apart from each other.

The mounting rails 130*a* and 130*b* are installed in two rows, and vertically connect the middles of the first and second frames 110 and 120 while protruding forward. One mounting rail 130*a* of the two mounting rails 130*a* and 130*b* has one end fixed to the second frame 120 and the other end fixed to the first frame 110. The one mounting rail 130*a* of the two mounting rails 130*a* and 130*b* plays two roles. One role is to fix the first and second frames 110 and 120 such that the first and second frames 110 and 120 are spaced apart from each other, and the other role is to fix the battery pack 300 in cooperation with the other mounting rail 130*b*.

The other mounting rail 130*b* of the two mounting rails 130*a* and 130*b* has one end which is fixed to and supported by a reinforcement frame 125. The reinforcement frame 125 is a U-shaped frame which is connected to the second frame 120 and serves to support the one ends of the mounting rails 130*a* and 130*b*. The reinforcement frame 125 has a rectangular cross-section like the first and second frames 110 and 120. The U-shaped reinforcement frame 125 has both ends connected to both sides of the second frame 120. The first frame 110, the second frame 120, the mounting rails 130*a* and 130b and the reinforcement frame 125 are all made of a metallic material, and welded and connected as one body.

The two mounting rails 130a and 130b may have slit grooves 131a and 130b formed on one sides thereof. The slit grooves 131a and 130b are open in directions facing each other while being spaced apart from each other, and each have an open side, such that the battery pack 300 can be coupled through a rail-type structure.

The mounting rails 130a and 130b each have a stopper 135 against which one side of the battery pack 300 is pressed when the battery pack 300 is mounted through the rail-type structure, and by which the movement of the battery pack 300 is limited. The stopper 135 serves to prevent the battery pack 300 from separating from the mounting rails 130a and 130b. The stopper 135 serves to connect the one ends of the two mounting rails 130a and 130b so as to block the other sides of the slit grooves 131a and 131b. For example, the stopper 135 may be formed in a rectangular block shape to connect the one ends of the two mounting rails 130a and 130b.

Position fixing bolts 137 are fastened to the mounting rails 130a and 130b so as to protrude toward the slit grooves 131a and 131b, respectively. The position fixing bolts 137 may protrude toward the slit grooves 131a and 131b so as to come into contact with the other side of the battery pack 300 mounted on the mounting rails 130a and 130b, respectively, thereby fixing the position of the battery pack 300. For this structure, the slit grooves 131a and 131b may each have a fixing concave groove 133 which comes into contact with the outer circumference of an end portion of the corresponding position fixing bolt 137.

For example, when the jig body 100 is rotated so that the entrances of the slit grooves 131a and 131b face the floor, the battery pack 300 falls on the floor, due to its weight. Therefore, the position fixing bolts 137 may support the other side of the battery pack 300 coupled to the mounting rails 130a and 130b, thereby preventing the battery pack 300 from falling on the floor due to its weight. Since the position fixing bolts 137 fix the position of the battery pack 300 coupled to the mounting rails 130a and 130b while supporting the other side of the battery pack 300, the position fixing bolts 137 may fix the battery pack 300 without damaging the battery.

The mounting rail 130a has one or more fastening holes which communicate with the slit groove 131a such that the position fixing bolt 137 is fastened to the corresponding fastening hole, and the mounting rail 130b has one or more fastening holes which communicate with the slit groove 131b such that the position fixing bolt 137 is fastened to the corresponding fastening hole. The fixing concave groove 133 may be formed in each of the slit grooves 131a and 131b corresponding to the fastening hole, such that the position fixing bolt 137 protrudes to the slit groove. Furthermore, the position fixing bolts 137 protruding to the slit grooves 131a and 131b support the other side of the battery pack 300, while the outer circumferential surfaces thereof are inserted into the fixing concave grooves 133, respectively. Therefore, the position fixing bolts 137 may stably fix the other side of the battery pack 300.

That is, since one side of the battery pack 300 mounted on the mounting rails 130a and 130b is brought into contact with the stopper 135 and the other side thereof is brought into contact with the position fixing bolt 137, the battery pack 300 may not be separated from the mounting rails 130a and 130b, but stably fixed.

The first frame 110 has a jig rotation handle 139. The jig rotation handle 139 is formed on either side of the front surface of the first frame 110 and protrudes in a direction orthogonal to the first frame 110, such that an operator easily rotates the jig body 100 with the jig rotation handle 139 held on the operator's hand. The jig rotation handle 139 may have a rounded outer circumferential surface which has been subjected to an anti-slip treatment.

The anode units 140a and 140d and the cathode units 140b and 140c are disposed on both sides of the mounting rails 130a and 130b.

The anode units 140a and 140d and the cathode units 140b and 140c may come in contact with first and second terminals 311 and 312 of the battery pack 300 coupled to the mounting rails 130a and 130b, respectively.

The anode units 140a and 140d and the cathode units 140b and 140c are symmetrically installed on both sides of the mounting rails 130a and 130b, such that the pairs of anode and cathode units are placed in parallel to each other. The anode units 140a and 140d and the cathode units 140b and 140c are cross-arranged at positions facing each other, such that the anode units 140a and 140d face each other and the cathode units 140b and 140c face each other. Therefore, the anode units 140a and 140d and the cathode units 140b and 140c are located to face each other not only in the top-to-bottom direction but also in the side-to-side direction.

For example, when the anode unit 140a and the cathode unit 140b, which are arranged on one side of the mounting rails 130a and 130b, are located at the top and bottom, respectively, the anode unit 140d and the cathode unit 140c, which are disposed on the other side of the mounting rails 130a and 130b, are located at the bottom and top, respectively. This is in order to implement a structure in which the battery pack 300 can be freely mounted on the jig body 100 in the horizontal direction or vertical direction.

First, the structure in which the battery pack is vertically mounted on the jig body will be described.

FIG. 2 is a perspective view illustrating that the battery pack is mounted on the jig for a battery charging and discharging test in accordance with the embodiment of the present disclosure, and FIG. 3 is a perspective view illustrating the battery pack in accordance with the embodiment of the present disclosure, showing that the battery pack is separated into a battery and support covers.

Referring to FIG. 2, the battery pack 300 may be vertically mounted on the mounting rails 130a and 130b. In an embodiment, the battery pack 300 is mounted through a method of inserting insertion ribs 321 and 331, which are formed on one sides of the front and rear surfaces of the battery pack 300 and elongated in the longitudinal direction thereof, into the slit grooves 131a and 131b of the mounting rails 130a and 130b. In this case, the battery pack 300 is selectively mounted on one side (the left side in FIG. 2) or the other side (the right side in FIG. 2) of the mounting rails 130a and 130b.

Referring to FIGS. 2 and 3, the battery pack 300 has a structure in which support covers 320 and 330 are coupled to one sidewall and the other sidewall of a battery 310. The support covers 320 and 330 serve as mounting jigs for mounting the battery 310 on the mounting rails 130a and 130b.

The battery 310 has the first terminal 311 and the second terminal 312, and is formed in a prismatic shape. Specifically, the first and second terminals 311 and 312 are provided on one side of the battery 310 so as to be spaced apart from each other.

The support covers 320 and 330 are constituted by a first support cover 320 and a second support cover 330. The first and second support covers 320 and 330 are brought into contact with the one sidewall and the other sidewall of the battery 310, and fixed to each other by a fixing unit. The fixing unit is provided as a fixing pin which is coupled to a fixing hole (a) formed in each of the four corners of the first and second support covers 320 and 330, thereby stably maintaining the state in which the first and second support covers 320 and 330 are brought into contact with the one sidewall and the other sidewall of the battery 310, respectively.

The first and second support covers 320 and 330 have the insertion ribs 321 and 331 which are formed on the outer surfaces thereof, and inserted into the slit grooves 131a and 131b of the mounting rails 130a and 130b. The insertion ribs 321 and 331 are formed on one sides of the outer surfaces of the first and second support covers 320 and 330, respectively, so as to be elongated in the longitudinal direction thereof. The insertion ribs 321 and 331 correspond to the slit grooves 131a and 131b of the mounting rails 130a and 130b, and the edges of end portions thereof are rounded to make it easy to move and insert the insertion ribs 321 and 331 into the slit grooves 131a and 131b.

The first and second support covers 320 and 330 have seating surfaces c facing each other, and the battery 310 is seated on the seating surfaces c. The seating surfaces c serve to stably fix the battery 310 between the first and second support covers 320 and 330. One side of the seating surface c may be open. Through the opening, the first and second terminals 311 and 312 of the battery 310 may be exposed to the outside, and connected to the anode unit 140a and the cathode unit 140b. The first and second support covers 320 and 330 may be both made of an insulating material.

The battery 310 illustrated in FIG. 3 has a structure in which the first and second terminals 311 and 312 are arranged in parallel to each other on one side of the battery 310 so as to be spaced apart from each other. Therefore, the battery 310 is vertically mounted on the mounting rails 130a and 130b, and connected to the anode unit 140a and the cathode unit 140b which are arranged on one side of the mounting rails 130a and 130b. For this structure, the first and second support covers 320 and 330 having the insertion ribs 321 and 331, which are formed on one sides of the outer surfaces thereof, respectively, and elongated in the longitudinal direction thereof, are coupled to the battery 310.

Referring back to FIG. 2, the jig body 100 has connection rails 160 installed on both sides of the mounting rails 130a and 130b so as to connect the first and second frames 110 and 120, The connection rail 160 has a moving member 170 which is movable along the connection rail 160. The moving member 170 is connected to at least one of the anode unit 140a or 140d and the cathode unit 140b or 140c so as to be movable along the connection rail 160. For example, the moving member 170 may be connected to the anode unit 140a or the cathode unit 140c which is located at the top, and moved away from or close to the cathode unit 140b or the anode unit 140d which is located at the bottom.

FIG. 4 is a front view illustrating the jig for a battery charging and discharging test in accordance with the embodiment of the present disclosure.

Referring to FIGS. 2 and 4, the anode units 140a and 140d and the cathode units 140b and 140c each include a support block 141, a terminal body 142, an elastic spring 143, a movable shaft 144, a lever 145, a bearing bracket 146 and a bearing fixing bracket 147.

The support block 141 is formed in a hollow hexahedral shape. The support block 141 has a rear surface fixed to a support rod 181 for connecting the first and second frames 110 and 120 and a support plate 182 movably installed on the support rod 181. The support block 141 is a structure for supporting the terminal body 142, the elastic spring 143, the movable shaft 144 and the like.

The terminal body 142 is formed in a cylindrical shape, and installed through the support block 141. The terminal body 142 has a terminal pin p protruding from a leading end thereof. The terminal pin p protruding from the leading end of the terminal body 142 is selectively connected to the first and second terminals 311 and 312 of the battery pack 300. The elastic spring 143 is installed on the outer circumferential surface of the terminal body 142 protruding to the outside of the support block 141, placed between the support block 141 and a protrusion 142a formed at the leading end of the terminal body 142, and provides an elastic force that causes the terminal pin p to protrude from the support block 141. The elastic spring 143 brings the terminal pin p into close contact with the first or second terminal 311 or 312 of the battery pack 300 such that the electrical connection between the terminal pin p and the first or second terminal 311 or 312 is stably maintained, when the terminal pin p is connected to the first or second terminal 311 or 312.

The movable shaft 144 is placed coaxially with the terminal body 142, and connected to a terminal pin p2 protruding from the rear end of the terminal body 142, and serves to supply power to the terminal pin p. The movable shaft 144 may be connected to a power supply, and transfer the supplied power to the terminal pin p.

The lever 145 is connected to the movable shaft 144, and reciprocates the movable shaft 144 by pushing or pulling the movable shaft 144. For example, the lever 145 is rotated to pull the movable shaft 144, thereby pulling the terminal body 142. Then, the terminal pin p at the leading end of the terminal body 142 is pulled away from the terminal of the battery pack 300. Furthermore, when the lever 145 is returned to the original position, the lever 145 pushes the movable shaft 144, thereby pushing the terminal body 142. Then, the terminal pin p at the leading end of the terminal body 142 is moved toward the terminal of the battery pack 300. This structure can be applied when the anode unit 140a and the cathode unit 140c are moved according to the position of the terminal of the battery pack 300.

The rotation stroke of the lever 145 is limited by a stopper protrusion 183 for limiting rotation. Since the lever 145 pushes the movable shaft 144 while supported by the stopper protrusion 183, the terminal pin p at the leading end of the terminal body 142 is moved toward the terminal of the battery pack 300.

As illustrated in FIG. 4, when the lever 145 is pressed, the lever 145 pulls the movable shaft 144 while rotated around a shaft connected to the movable shaft 144, and the movable shaft 144 pulls the terminal body 142 in a direction ① that the terminal pin p at the leading end of the terminal body 142 is moved away from the terminal of the battery pack 300. In this state, when an operator holds the lever 145 and moves the lever 145 in an upward direction ②, the support plate 182 to which the support block 141 is fixed is moved upward along the support rod 181. When the force to press the lever 145 is removed at a position corresponding to the second terminal 312 of the battery pack 300, the lever 145 is returned to the original position, and the terminal pin p at the leading end of the terminal body 142 is moved toward the terminal of the battery pack 300 and connected to the second terminal 312.

The support plate 182 to which the support block 141 at the bottom in FIG. 4 is fixed has spacing members 184 which are formed on both sides of the top thereof so as to protrude upward. The spacing members 184 serve to space the anode unit 140a or 140d and the cathode unit 140b or 140c apart from each other, thereby preventing an electrical short circuit or the like. The spacing member 184 may be formed of an insulating material.

The bearing bracket 146 is coupled to the outer circumference of the terminal body 142 located in the support block 141, such that the terminal body 142 is movably supported. The bearing bracket 146 supports the terminal body 142 such that the terminal body 142 can be moved in connection with the movement of the movable shaft 144.

The bearing fixing bracket 147 has one side disposed in the support block 141 and coupled to the outer circumference of the bearing bracket 146 and the other side disposed and fixed outside the support block 141. For example, one side of the bearing fixing bracket 147 may be disposed in the support block 141 and coupled to the outer circumference of the bearing bracket 146 and the other side thereof may be fixed to the support plate 182 for supporting the support block 141.

FIGS. 5 and 6 are diagrams illustrating a method of mounting the battery pack on the jig for a battery charging and discharging test in accordance with the embodiment of the present disclosure.

Referring to FIG. 5, the battery pack 300 may be selectively mounted on one side (the left side in the drawing) or the other side (the right side in the drawing) of the mounting rails 130a and 130b. For example, when the battery pack 300 is mounted on the one side (the left side in the drawing) of the mounting rails 130a and 130b, no component is mounted on the other side (the right side in the drawing) of the mounting rails 130a and 130b.

When the battery pack 300 is mounted on the one side of the mounting rails 130a and 130b, the battery pack 300 is located so that the insertion ribs 321 and 331 correspond to the mounting rails 130a and 130b. Next, the first and second terminals 311 and 312 of the battery pack 300 are located on the opposite side of the mounting rails 130a and 130b, and then the insertion ribs 321 and 331 are inserted into the slit grooves 131a and 131b of the mounting rails 130a and 130b. At this time, the battery pack 300 is inserted until the battery pack 300 comes into close contact with the stopper 135. When the battery pack 300 is brought into contact with the stopper 135, the terminal pin p of the cathode unit 140b is connected to the first terminal 311 of the battery pack 300.

Next, the operator presses the lever 145 to pull the terminal pin p of the anode unit 140a at the top to the left, and moves the anode unit 140a upward, such that the terminal pin p of the anode unit 140a is placed at a position corresponding to the second terminal 312 of the battery pack 300. Then, when the force having pressed the lever 145 is removed, the lever 145 is returned to the original position, and the terminal pin p of the anode unit 140a is connected to the second terminal 312 of the battery pack 300. Thus, the anode unit 140a and the cathode unit 140c are electrically connected to the first and second terminals 311 and 312 of the battery pack 300, such that a charging and discharging test can be performed. For example, the names of the first and second terminals 311 and 312 of the battery pack 300 may be mixedly used depending on the positions where the first and second terminals 311 and 312 are mounted.

The jig 10 for a battery charging and discharging test includes the rotating unit 200. The jig 10 for a battery charging and discharging test may be rotated by the rotating unit 200 such that the battery 310 can be disposed at various angles.

FIG. 7 is a rear view illustrating the jig for a battery charging and discharging test in accordance with the embodiment of the present disclosure, FIG. 8 is a rear view illustrating that the jig for a battery charging and discharging test in accordance with the embodiment of the present disclosure is rotated, and FIG. 9 is a front view illustrating that the jig for a battery charging and discharging test in accordance with the embodiment of the present disclosure is rotated.

Referring to FIG. 7, the rotating unit 200 includes a rotating plate 210, a rotating shaft 220 and a fixing support bar 230.

The rotating plate 210 is a rectangular plate to connect the rear surfaces of the first and second frames 110 and 120. For example, the rotating plate 210 connects the rear surfaces of the first and second frames 110 and 120 between the support plates 182, and is spaced apart from the support plates 182.

The rotating shaft 220 is provided in the center of the rotating plate 210, and serves as the center of rotation of the rotating plate 210. The fixing support bar 230 has one end fixed to the rotating shaft 220 and the other end protruding to the outside of the rotating plate 210. The other end of the fixing support bar 230, protruding to the outside of the rotating plate 210, may be fixed to the ceiling or inner wall of a chamber for the charging and discharging test. In this state, an operator may rotate the jig body 100.

The fixing support bar 230 is formed in an L-shape, such that the one end of the L-shaped fixing support bar 230 is connected to the rotating shaft 220, and the other end thereof is elongated to protrude to the outside of the rotating plate 210.

As illustrated in FIG. 8, when the jig body 100 is rotated in the clockwise direction about the rotating shaft 220, the jig body 100 can be rotated by 90, 180 or 270 degrees. When the jig body 100 is rotated by 90 degrees, the battery pack 300 vertically disposed on the jig body 100 may be horizontally disposed.

As illustrated in FIG. 9, when the jig body 100 is rotated by 90 degrees about the rotating shaft 220, the battery pack 300 vertically disposed on the jig body 100 is horizontally disposed. At this time, since one side of the battery pack 300 is supported by the stopper 135 and the other end thereof is supported by the position fixing bolt 137, the state in which the battery pack 300 is mounted on the mounting rails 130a and 130b is stably maintained.

The rotation of the jig body 100 is performed by an operator holding the jig rotation handle 139, and the jig rotation handle 139 is formed in a shape to protrude from either side of the front surface of the first frame 110. Thus, although the jig body 100 is vertically or horizontally disposed, the operator may easily rotate the jig body 100 with the jig rotation handle 139 held on the operator's hand.

In the jig 10 for a battery charging and discharging test in accordance with the embodiment of the present disclosure, the jig body 100 may be rotated by 0, 90, 180 or 270 degrees, such that the battery can be disposed at various angles during a charging and discharging test.

The first frame 110 has the jig rotation handle 139. The jig rotation handle 139 is formed on either side of the front surface of the first frame 110 and protrudes in a direction orthogonal to the first frame 110, such that an operator easily rotates the jig body 100 with the jig rotation handle 139 held on the operator's hand. The jig rotation handle 139 may have a rounded outer circumferential surface which has been subjected to an anti-slip treatment.

In another embodiment, the battery pack may include a battery having terminals provided on both sides thereof. In this case, the shape of the battery pack may be different from the shape of the battery pack in accordance with the above-described embodiment.

FIG. 10 is a perspective view illustrating a battery pack in accordance with another embodiment of the present disclosure, showing that the battery pack is separated into a battery and support covers.

Referring to FIG. 10, a battery pack 300a in accordance with the another embodiment of the present disclosure has a structure in which support covers 320a and 330a are coupled to one sidewall and the other sidewall of a battery 310a. The support covers 320a and 330a serve as mounting jigs for mounting the battery 310a on the mounting rails 130a and 130b.

The battery 310a has the first terminal 311 and the second terminal 312, and is formed in a prismatic shape. Specifically, the first and second terminals 311 and 312 are provided on both sides of the battery 310a.

The support covers 320a and 330a are constituted by a first support cover 320a and a second support cover 330a. The first and second support covers 320a and 330a are brought into contact with the one sidewall and the other sidewall of the battery 310a, respectively, and fixed to each other by a fixing unit. The fixing unit is provided as a fixing pin b which is coupled to a fixing hole a formed in each of the four corners of the first and second support covers 320a and 330a, thereby stably maintaining the state in which the first and second support covers 320a and 330a are brought into contact with the one sidewall and the other sidewall of the battery 310a.

The first and second support covers 320a and 330a have insertion ribs 321 and 331 which are formed on the outer surfaces thereof, and inserted into the slit grooves 131a and 131b of the mounting rails 130a and 130b. The insertion ribs 321 and 331 are formed on the middles of the outer surfaces of the first and second support covers 320a and 330a, respectively, so as to be elongated in the widthwise direction thereof. The insertion ribs 321 and 331 correspond to the slit grooves 131a and 131b of the mounting rails 130a and 130b, and the edges of end portions thereof are rounded to make it easy to move and insert the insertion ribs 321 and 331 into the slit grooves 131a and 131b.

The first and second support covers 320a and 330a have seating surfaces c facing each other, such that the battery 310a is seated on the seating surfaces c. The seating surfaces c serve to stably fix the battery 310a between the first and second support covers 320a and 330a. The first and second support covers 320a and 330a may be both made of an insulating material.

The battery 310a illustrated in FIG. 10 has a structure in which the first and second terminals 311 and 312 are symmetrically disposed on both sides of the battery 310a. Therefore, the battery 310a is horizontally mounted on the mounting rails 130a and 130b, and connected to the anode unit 140d and the cathode unit 140b which are disposed on both sides of the mounting rails 130a and 130b. For this structure, the support covers 320a and 330a having the insertion ribs 321 and 331, which are formed on the middles of the outer surfaces thereof and elongated in the widthwise direction thereof, are coupled to the battery 310a.

FIG. 11 is a perspective view illustrating that the battery pack in accordance with the another embodiment of the present disclosure is mounted on the jig for a battery charging and discharging test.

Referring to FIG. 11, the insertion ribs 321 and 331 of the battery pack 300a are inserted into the mounting rails 130a and 130b until the insertion ribs 321 and 331 are brought into contact with the stopper 135. When the battery pack 300a is brought into contact with the stopper 135, the terminal pin p of the cathode unit 140b on one side of the mounting rails 130a and 130b is brought into contact with the second terminal 312 of the battery pack 300a, and the first terminal 311 of the battery pack 300a may be connected to the terminal pin p of the anode unit 140d.

In the present embodiment, the arrangement positions of the anode units and the cathode units may be randomly set. When the anode units and the cathode units are cross-arranged to face each other, the arrangement priority thereof is not limited.

FIG. 12 is a perspective view illustrating that the jig for a battery charging and discharging test in accordance with the embodiment of the present disclosure is rotated at various angles.

Referring to FIG. 12, a plurality of jigs 10, 10-1 and 10-2 for a battery charging and discharging test may be fixed into a chamber for a battery charging and discharging test. Among the jigs 10, 10-1 and 10-2, the jig 10 for a battery charging and discharging test may be disposed in a 0-degree direction, such that the battery pack 300 is disposed vertically with respect to the bottom surface. The jig 10-1 for a battery charging and discharging test is rotated and disposed in a 90-degree direction, such that the battery pack 300 is disposed horizontally with respect to the bottom surface. Furthermore, the battery pack 300a having the first and second terminals 311 and 312 provided on both sides thereof may be coupled to the jig 10-2 for a battery charging and discharging test, and thus disposed horizontally with respect to the bottom surface.

When the above-described jigs 10, 10-1 and 10-2 for a battery charging and discharging test are applied, the battery 310 or 310a may be disposed horizontally or vertically with respect to the bottom surface through one jig, and thus subjected to a battery charging and discharging test. Furthermore, the battery 310 having the first and second terminals 311 and 312 provided only on one side thereof and spaced apart from each other and the battery 310a having the first and second terminals 311 and 312 provided on both sides thereof may be both fixed by the jigs 10, 10-1 and 10-2 for a battery charging and discharging test, and thus subjected to the battery charging and discharging test.

That is, the battery 310 or 310a may be disposed at various angles of 0, 90, 180 and 270 degrees through the jigs 10, 10-1 and 10-2 for a battery charging and discharging test in accordance with the embodiment of the present disclosure, such that the charging and discharging test can be performed under various test environments. Furthermore, the jigs can be applied to not only a prismatic battery having terminals on both sides thereof but also a prismatic battery having terminals on one side thereof, thereby making it possible to perform various charging and discharging tests suitable for various environments.

The above-described battery may be applied to an electric vehicle, and used to perform various charging and discharging tests according to an operation of the electric vehicle.

Although the preferred exemplary embodiments of the present disclosure have been described above, it is understood that the present disclosure may be modified in various forms, and those skilled in the art may practice various modified examples and changed examples without departing from the scope of the claims of the present disclosure.

The invention claimed is:

1. A jig for a battery charging and discharging test, comprising:
   a first frame and a second frame which are disposed in parallel to each other so as to be spaced apart from each other;
   two mounting rails installed to protrude forward, configured to connect the first and second frames, and having slit grooves which are open in directions facing each other and each have an open side, such that the battery pack is mounted on the mounting rails through a rail-type structure; and
   an anode unit and a cathode unit which are symmetrically arranged to face each other with the mounting rails in between, such that the pairs of anode and cathode units are placed in parallel to each other, and brought into contact with a first terminal and a second terminal of the battery pack coupled to the mounting rails, respectively,
   wherein the anode units and the cathode units are cross-arranged to face each other with the mounting rails in between, and also face each other in a direction parallel to the mounting rails, and the pairs of anode unit and cathode unit facing each other with the mounting rails in between can be moved individually in a direction away from or closer to the neighboring the cathode unit and the anode unit, respectively.

2. The jig of claim 1, further comprising a connection rail installed on either side of the mounting rails and configured to connect the first and second frames, wherein the connection rail has a moving member installed thereon, and the moving member is connected to at least one of the anode unit and the cathode unit so as to be movable along the connection rail.

3. The jig of claim 1, wherein each of the anode unit and the cathode unit comprises:
   a support block formed in a hollow hexahedral shape;
   a terminal body installed through the support block, and having a terminal pin protruding from a leading end thereof; and
   an elastic spring installed on the outer circumferential surface of the terminal body protruding to the outside of the support block, disposed between the support block and a protrusion at the leading end of the terminal body, and configured to provide an elastic force that causes the terminal pin to protrude from the support block.

4. The jig of claim 3, wherein each of the anode unit and the cathode unit comprises:
   a movable shaft disposed coaxially with the terminal body, connected to the terminal pin protruding from the rear end of the terminal body, and configured to supply power to the terminal pin; and
   a lever connected to the movable shaft, and configured to reciprocate the movable shaft by pushing or pulling the movable shaft.

5. The jig of claim 3, comprising:
   a bearing bracket coupled to the outer circumference of the terminal body located in the support block, and configured to movably support the terminal body; and
   a bearing fixing bracket having one side disposed in the support block and coupled to the outer circumference of the bearing bracket and the other side disposed and fixed outside the support block.

6. The jig of claim 1, further comprising:
   a rotating plate configured to connect the rear surfaces of the first and second frames;
   a rotating shaft provided in the center of the rotating plate, and serving as the center of rotation of the rotating plate; and
   a fixing support bar having one end fixed to the rotating shaft.

7. The jig of claim 6, wherein the fixing support bar is elongated to have an end that protrudes to the outside of the rotating plate.

8. The jig of claim 1, wherein the first frame has a jig rotation handle which is provided on either side of the front surface thereof and protrudes in a direction orthogonal to the first frame.

9. The jig of claim 1, wherein the mounting rail has a stopper with which one side of the battery pack is brought into contact and by which the movement of the battery pack is limited, when the battery pack is mounted through a rail-type structure.

10. The jig of claim 1, further comprising a U-shaped reinforcement frame connected to the second frame and configured to support one end of the mounting rail.

11. The jig of claim 1, wherein the battery pack comprises:
    a prismatic battery having the first and second terminals; and
    a first support cover and a second support cover which are brought into contact with one sidewall and the other sidewall of the battery, fixed to each other by a fixing unit, and each have an insertion rib formed on the outer surface thereof so as to be inserted into the slit groove of the corresponding mounting rail.

12. The jig of claim 11, wherein the first and second terminals are provided on both sides of the battery, and the insertion ribs are formed on the middles of the outer surfaces of the first and second support covers, respectively, and elongated in a widthwise direction thereof.

13. The jig of claim 11, wherein the first and second terminals are provided on one side of the battery so as to be spaced apart from each other, and the insertion ribs are formed on one sides of the outer surfaces of the first and second support covers, respectively, and elongated in a longitudinal direction thereof.

14. The jig of claim 11, wherein the first and second support covers have seating surfaces facing each other, such that the battery is seated on the seating surfaces.

* * * * *